United States Patent
Liu et al.

(10) Patent No.: US 12,395,187 B2
(45) Date of Patent: Aug. 19, 2025

(54) COMPUTER ARCHITECTURE WITH DATA DECOMPRESSION SUPPORT FOR NEURAL NETWORK COMPUTING

(71) Applicant: MediaTek Inc., Hsinchu (TW)

(72) Inventors: Chih-Chun Liu, Hsinchu (TW); Liang-Yu Chen, Hsinchu (TW); Yao Ting Wang, Hsinchu (TW)

(73) Assignee: MediaTek, Inc., Hsinchu (TW)

( * ) Notice: Subject to any disclaimer, the term of this patent is extended or adjusted under 35 U.S.C. 154(b) by 188 days.

(21) Appl. No.: 18/451,925

(22) Filed: Aug. 18, 2023

(65) Prior Publication Data
US 2025/0062778 A1    Feb. 20, 2025

(51) Int. Cl.
*H03M 7/30*     (2006.01)
*G06F 7/483*    (2006.01)
*G06F 17/16*    (2006.01)

(52) U.S. Cl.
CPC ....... *H03M 7/6005* (2013.01); *H03M 7/3082* (2013.01); *G06F 7/483* (2013.01); *G06F 17/16* (2013.01)

(58) Field of Classification Search
CPC ... H03M 7/6005; H03M 7/3082; G06F 17/16; G06F 7/483
See application file for complete search history.

(56) References Cited

U.S. PATENT DOCUMENTS

2021/0284423 A1*  9/2021  Cowen .................. B65D 85/70

* cited by examiner

*Primary Examiner* — Joseph J Lauture
(74) *Attorney, Agent, or Firm* — Tong J. Lee

(57) ABSTRACT

A processor decompresses a compressed data vector into an original data vector. The processor includes an execution circuit, which receives a decompress instruction that includes two input operands and an output operand. The input operands indicate an address of the compressed data vector in a memory, and the output operand indicates the vector register for storing the original data vector after decompression. The execution circuit executes the decompress instruction to decompress the compressed data vector. When executing the decompress instruction, the execution circuit performs the following operations: read a mask value from the mask register, the mask value being a binary sequence indicating zero positions in the original data vector; generate a selection signal based on the mask value; and generate the original data vector by applying the selection signal to a selection switch that receives the compressed data vector as input.

20 Claims, 8 Drawing Sheets

COMPUTER ARCHITECTURE WITH DATA DECOMPRESSION SUPPORT FOR NEURAL NETWORK COMPUTING

TECHNICAL FIELD

Embodiments of the invention relate to a computer architecture that supports data decompression; more specifically, computer instructions for decompressing neural network weights.

BACKGROUND OF THE INVENTION

The performance of a computer architecture is typically measured in terms of its speed, accuracy, and energy efficiency. These metrics are critical for neural computing. As neural network models continue to grow in complexity and size, computer architectures need to continue to evolve to meet the demands of neural computing.

Neural networks often process large datasets and require fast access to massive amounts of data. A computer architecture generally incorporates memory hierarchies that include fast on-chip memory to minimize data access latencies. However, due to the limited capacity of on-chip memory, large memory bandwidth is needed to supply the required data from off-chip memory devices. The need for a large memory bandwidth not only increases power consumption but also degrades the processor's performance.

One existing approach to the memory bandwidth problem is to compress neural computing data and store the compressed data in an off-chip memory device. The compression can significantly reduce the memory bandwidth required for data access. Currently, a processor such as a digital signal processor (DSP) may first retrieve the compressed data from the memory and perform data decompression at runtime. The decompression of a large neural network model can be time-consuming and can lower the overall processor performance. Therefore, there is a need for improving data decompression techniques to support efficient neural computing.

SUMMARY OF THE INVENTION

In one embodiment, a processor is operative to decompress a compressed data vector into an original data vector. The processor comprises a mask register, a general-purpose register file including a vector register, and an execution circuit. The execution circuit is operative to receive a decompress instruction that includes two input operands and an output operand. The input operands indicate an address of the compressed data vector in a memory. The output operand indicates the vector register for storing the original data vector after decompression. The execution circuit is further operative to execute the decompress instruction to decompress the compressed data vector. When executing the decompress instruction, the execution circuit is further operative to perform the following operations: read a mask value from the mask register, the mask value being a binary sequence indicating zero positions in the original data vector; generate a selection signal based on the mask value; and generate the original data vector by applying the selection signal to a selection switch that receives the compressed data vector as input.

In another embodiment, a method is provided for decompressing a compressed data vector into an original data vector. The method comprises the step of receiving a decompress instruction that includes two input operands and an output operand. The input operands indicate an address of the compressed data vector in a memory. The output operand indicates a vector register for storing the original data vector after decompression. The method further comprises the step of executing the decompress instruction to decompress the compressed data vector. The step of executing the decompress instruction further comprises: reading a mask value from the mask register, the mask value being a binary sequence indicating zero positions in the original data vector; generating a selection signal based on the mask value; and generating the original data vector by applying the selection signal to a selection switch that receives the compressed data vector as input.

Other aspects and features will become apparent to those ordinarily skilled in the art upon review of the following description of specific embodiments in conjunction with the accompanying figures.

BRIEF DESCRIPTION OF DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION OF THE INVENTION

Figure 1:
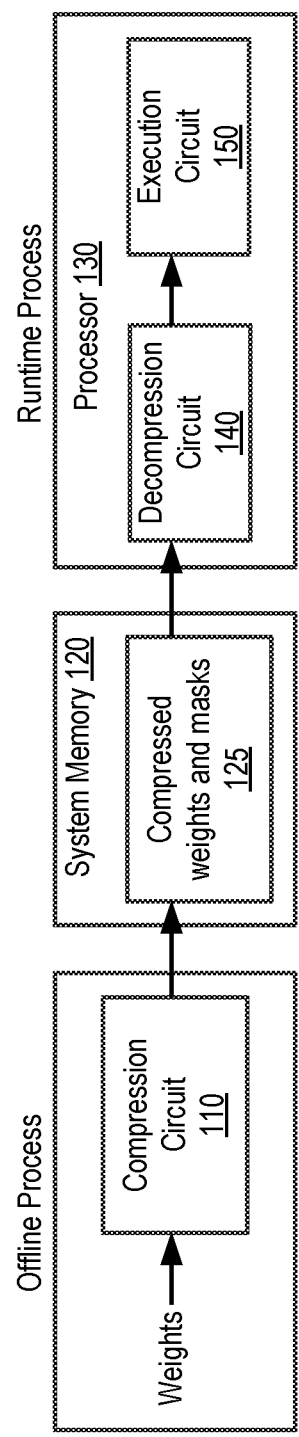
FIG. 1 is a diagram illustrating an overall process for data compression and decompression according to one embodiment.

In the following description, numerous specific details are set forth. However, it is understood that embodiments of the invention may be practiced without these specific details. In other instances, well-known circuits, structures, and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention extend the instruction set architecture (ISA) of a processor to provide instructions and hardware that support data decompression, such as the decompression of neural network weights. An example of the processor is a Reduced Instruction Set Computer (RISC) processor. A RISC processor may be a digital signal processor (DSP), a neural processing unit (NPU), a microprocessor, an accelerator, or another type of processing unit. Initially, the processor compresses neural network weights (or receives the already-compressed weights) and stores the compressed weights in memory. The memory may be a dynamic random access memory (DRAM) or another type of memory, which is coupled to the processor via a connection with limited bandwidth. In the following description, this memory is also referred to as a system memory. Compressing the data for transmission on the connection can reduce the demand for memory bandwidth.

During runtime (i.e., the inference phase) of neural network computations, the processor executes a first instruction to load a mask corresponding to a compressed weight vector from the system memory (e.g., DRAM) into a fast memory (e.g., a static random access memory (SRAM)), and a second instruction to read the mask from the fast memory into a mask register. The processor further executes a third instruction to load the compressed weight vector from the system memory into the fast memory, to decompress the compressed weight vector according to the mask in the mask register, and to save the decompressed weight vector into a vector register.

Compared to conventional RISC processors, the disclosed processor architecture uses fewer instructions to produce decompressed weights. The reduced number of instructions means fewer instruction fetch and decode, and, therefore, less memory bandwidth, fewer processing cycles, and smaller code size. As will be described in further detail below, the disclosed instruction architecture is applicable to a wide range of RISC instruction sets.

In one embodiment, the compression may be a zero-value compression (ZVC), which removes zeros from a data vector and stores the compression information in a mask in the memory. Other types of compressions for removing zeros from a data vector may also be used. Although the term "weight" or "neural network weight" is used in the following description in connection with data compression and decompression, it is understood that the instructions and the supporting hardware are applicable to any data not limited to weights. Furthermore, neural network weights may also be known as filter weights or kernel weights.

FIG. 1 is a diagram illustrating an overall process for data compression and decompression according to one embodiment. An example of the data is arrays of neural network weights. Initially, weights (i.e., original weights) are compressed by a compression circuit 110 in an offline process. The outputs of compression circuit 110 including compressed weights and masks 125 are sent to a system memory 120 for storage. The masks contain information for decompression. During a runtime process, a processor 130 loads compressed weights and masks 125 into an internal memory, and a decompression circuit 140 decompresses the compressed weights using the information in the masks. The output of decompression circuit 140 is decompressed weights, which are the same as the original weights. The decompressed weights are used by an execution circuit 150 to perform neural network operations. In one embodiment, decompression circuit 140 may include dedicated circuitry for supporting data decompression. In one embodiment, the execution circuit 150 may include an array of processing elements.

Figure 2:
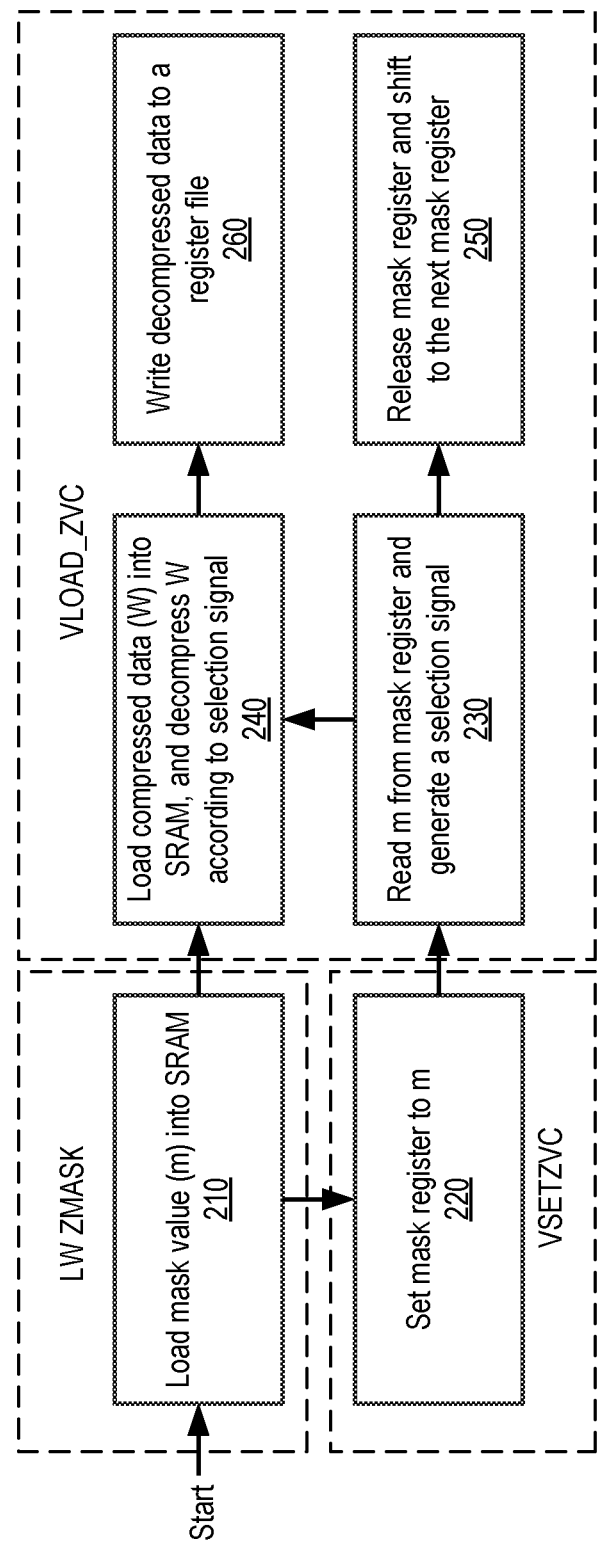
FIG. 2 is a block diagram illustrating a runtime decompression process according to one embodiment.

FIG. 2 is a block diagram illustrating a runtime decompression process according to one embodiment. In this example, three instructions are executed to decompress a data vector (e.g., an array of eight data values). It is understood that the example described herein can be extended to a data vector of any length and a data value of any bit-width, where each data value may be a weight used in neural computing. It is also understood that the example described herein can be extended to a mask value of any bit-width. Referring to FIG. 1 and FIG. 2, processor 130 at step 210 executes the instruction LOAD ZMASK to load a mask value (m) from system memory 120 into an internal memory such as SRAM. Examples of LOAD ZMASK include LW ZMASK, LOW ZMASK, and other bit-widths. In an alternative embodiment, LOAD ZMASK may be used to load multiple mask values in one instruction. At step 220, processor 130 executes the instruction VSETZVC to set the content of a mask register to m. At steps 230-260, processor 130 executes instruction VLOAD_ZVC to decompress a compressed data vector (W) using m. More specifically, at step 230, processor 130 reads m from the mask register and generates a selection signal. At step 240, processor 130 loads W from system memory 120 into SRAM and decompresses W according to the selection signal, and at step 250 releases the mask register and shifts a register select (FIG. 5) to the next mask register. The next mask register may be used to hold a next mask value corresponding to a next weight vector. At step 260, processor 130 writes decompressed data to a register file.

In one embodiment, the VSETZVC instruction has one input operand indicating a general-purpose register (e.g., gpr[i]) and one output operand indicating a mask register (e.g., zmask_reg); that is, the VSETZVC instruction may be written as VSETZVC zmask_reg, gpr[i]. In one embodiment, the VLOAD_ZVC instruction has two input operands indicating a base address and an offset of the memory location storing the mask and one output operand indicating a vector register (e.g., vector_reg[i]). That is, the VLOAD_ZVC instruction may be written as VLOAD_ZVC vector_reg[i], gpr[i], offset. The address of the memory location storing the mask can be calculated by adding the offset to the base address. It is understood that in alternative embodiments, the instructions described herein may be given different names. For example, VSETZVC may be referred to as a set_mask instruction, and VLOAD_ZVC may be referred to as a decompress instruction.

Figure 3A:
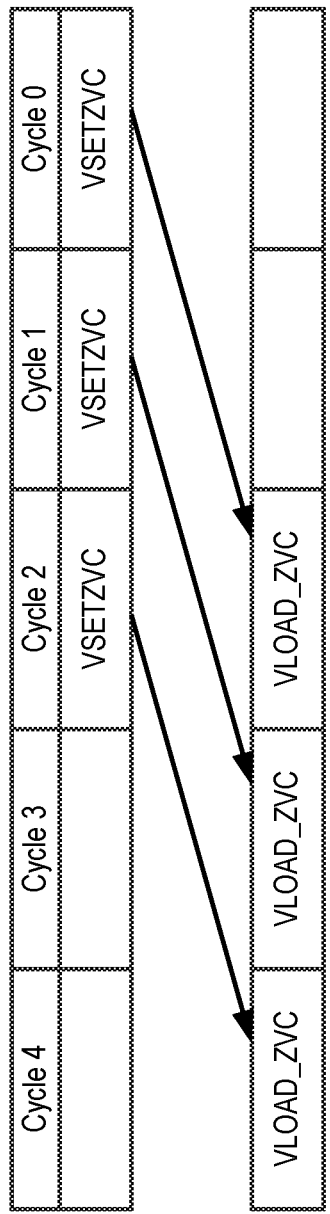
FIG. 3A and FIG. 3B illustrate examples of decompressing multiple weight vectors in a pipeline according to some embodiments.
Figure 3B:
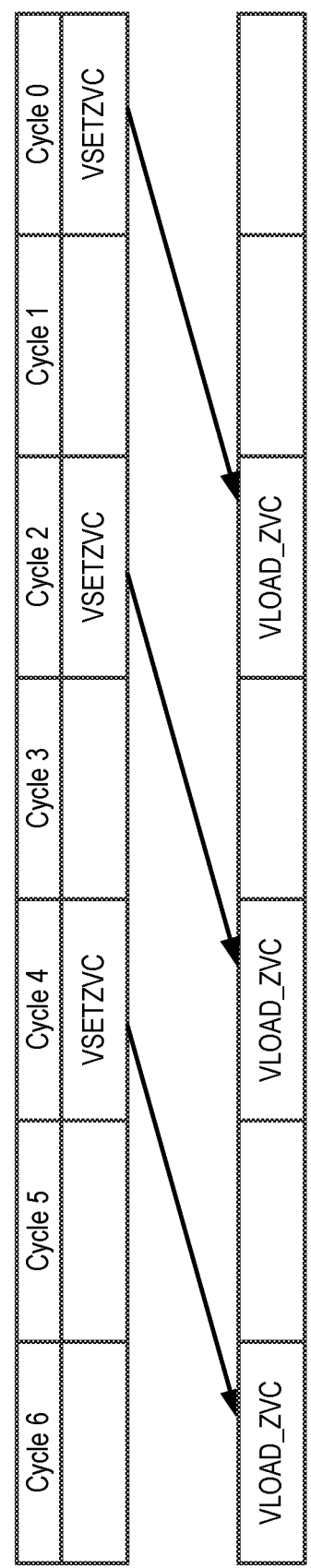

FIG. 3A and FIG. 3B illustrate examples of decompressing multiple weight vectors in a pipeline according to some embodiments. Pipelining the weight vector decompression enables instruction parallelism and hides the latency in decompressing each weight vector. In one embodiment, processor 130 includes multiple mask registers. The examples show that the output of VSETZVC is used by VLOAD_ZVC as input. FIG. 3A shows that VSETZVC (as well as VLOAD_ZVC) can be executed every cycle, and FIG. 3B shows that VSETZVC (as well as VLOAD_ZVC) can be executed every other cycle. In alternative embodiments, VSETZVC (as well as VLOAD_ZVC) can be executed every N cycles, where N is greater than 1. With multiple mask registers, the next VSETZVC can start (in cycle 1) before the first VLOAD_ZVC is executed (in cycle 2).

Figure 4:
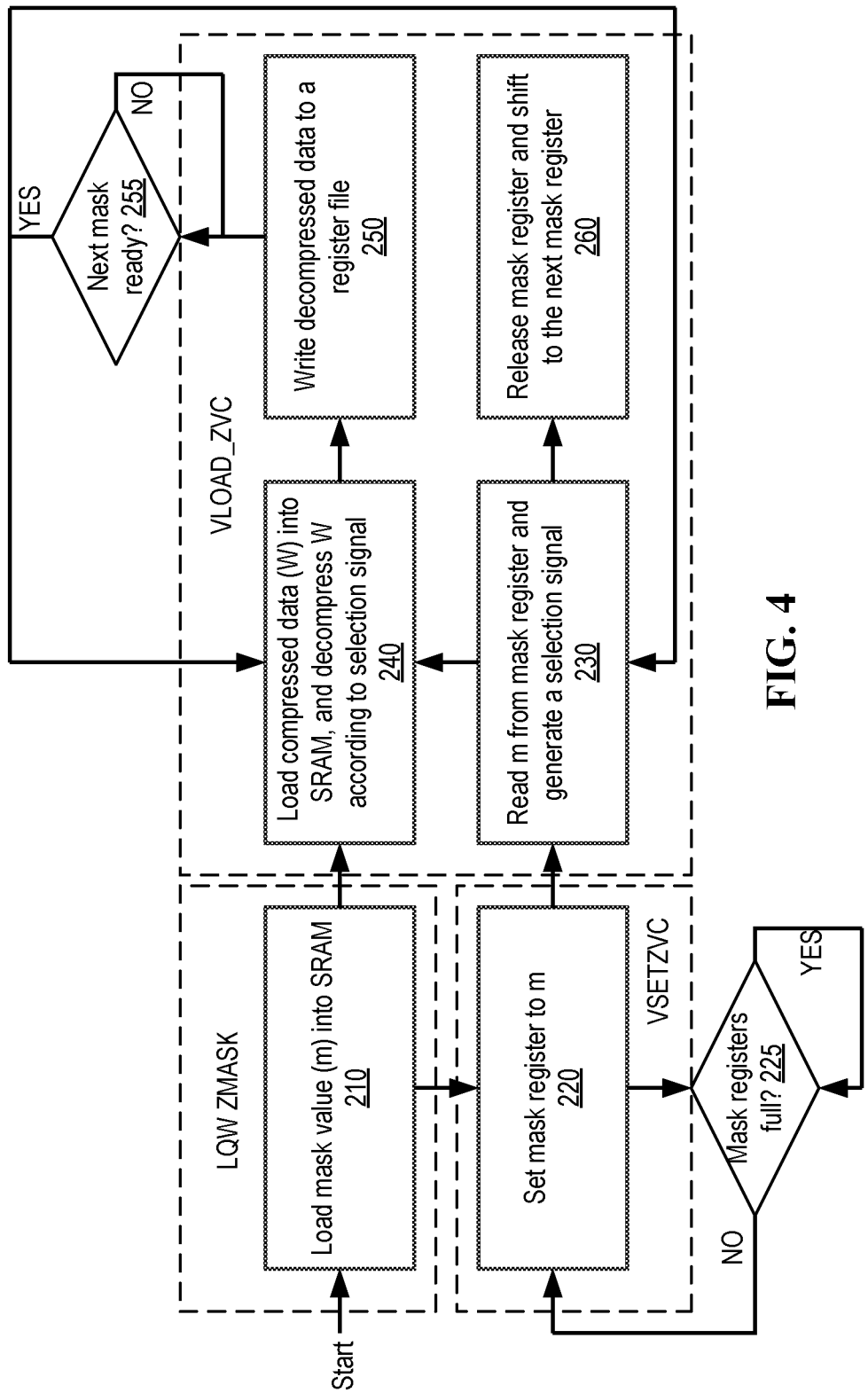
FIG. 4 is a block diagram illustrating a runtime decompression pipeline process according to one embodiment.

FIG. 4 is a block diagram illustrating a runtime decompression pipeline process according to one embodiment. FIG. 4 is similar to FIG. 2 except for the additional blocks describing the pipeline operations. It is understood that blocks with the same reference numerals in FIG. 2 and FIG.

4 refer to the same operations, and descriptions of these same operations may be omitted or simplified in connection with FIG. 4. In FIG. 4, processor 130 may execute step 210 (LW ZMASK) multiple times to load multiple mask values into SRAM. For a mask value (m), processor 130 at step 220 (VSETZVC) sets a mask register to m, and repeats step 220 for each subsequent mask value and mask register until all mask registers are full at step 225. Thereafter, processor 130 may repeat step 220 when an occupied mask register is released for reuse. The repetition of step 220 terminates when all mask values are either used for decompression or waiting in mask registers to be used for decompression.

At steps 230-260, processor 130 executes instruction VLOAD_ZVC to decompress a weight vector (W) using a corresponding mask value (m). After writing the decompressed weight vector into a register file at step 250, processor 130 determines whether the next mask is ready at step 255. In one embodiment, the next mask is ready when the mask value corresponding to the next weight vector is loaded into the next mask register. When the next mask is ready, processor 130 returns to step 230 to generate a selection signal, and continues to step 240 to perform decompression. The repetition of steps 230-260 terminates when all VLOAD_ZVC instructions in the program are executed.

Figure 5:
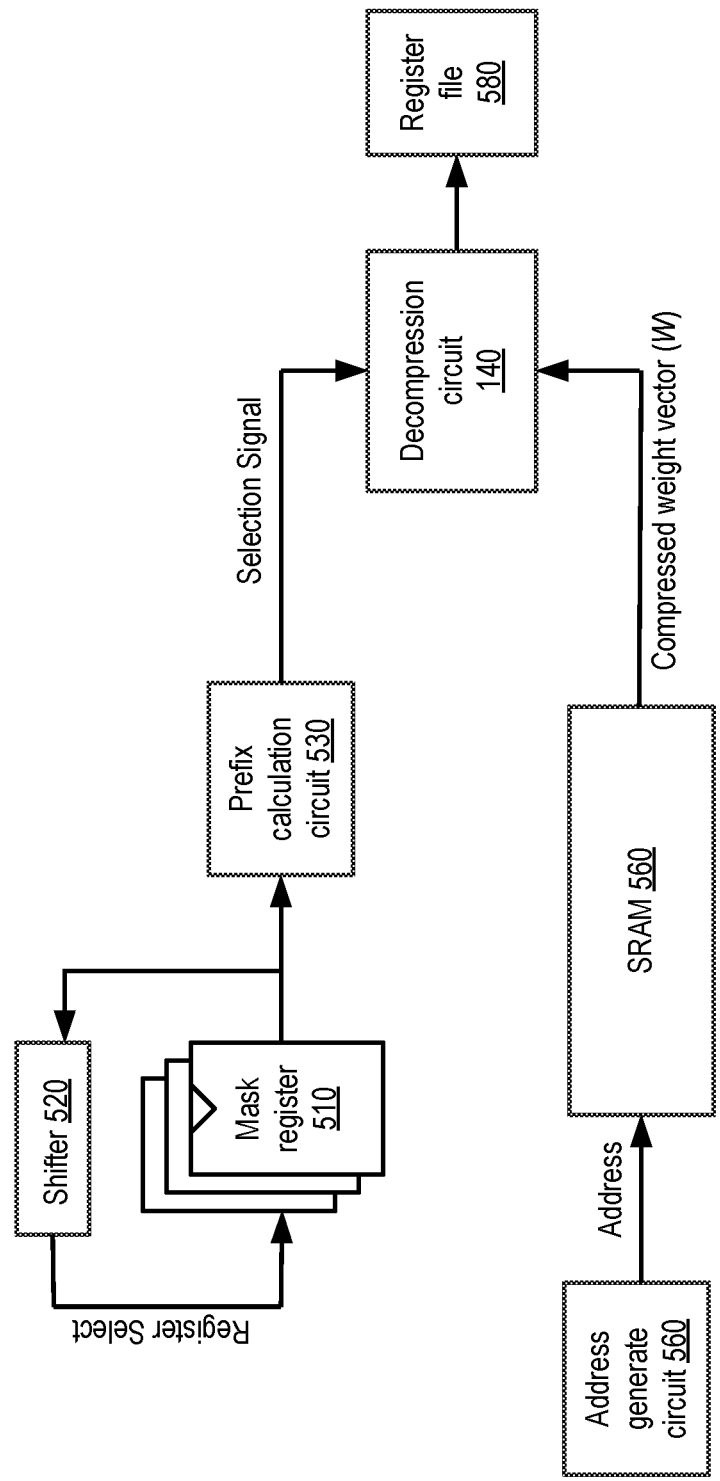
FIG. 5 is a block diagram illustrating decompression hardware circuits according to one embodiment.

FIG. 5 is a block diagram illustrating decompression hardware circuits according to one embodiment. More specifically, this example shows an embodiment of hardware circuits for executing VLOAD_ZVC. The hardware circuits include multiple mask registers 510 that are set to respective mask values, and a shifter circuit 520 that outputs a register select signal to activate a given mask register. The output of the given mask register is a mask value, which includes a sequence of mask bits (i.e., a binary sequence) indicating the positions of zeros in the corresponding weight vector. For example, a mask bit of 1 may indicate a non-zero weight value and a mask bit of 0 may indicate a zero-weight value. In alternative embodiments, the bit values of 1 and 0 may be replaced by logical values "true" and "false", respectively, or the meaning of 1 and 0 may be reversed. The hardware circuits further include an address generator circuit 560, which generates a memory address (e.g., an SRAM address) indicating the location of a compressed weight vector. The compressed weight vector is read from an SRAM 570 from the memory location and sent to a decompression circuit (e.g., decompression circuit 140 of FIG. 1).

The mask value from the given mask register is sent to a prefix calculation circuit 530, which generates an output (e.g., prefix vector (PV)) based on the non-zero positions of the mask value. In one embodiment, the prefix vector marks each non-zero mask bit and its succeeding zeros with a unique number.

For example, prefix calculation circuit 530 may receive an input of mask value bits=10011010 and output a prefix vector=33321100. The output of prefix calculation circuit 530 is sent to decompression circuit 140 for use as a selection signal. According to the selection signal, decompression circuit 140 decompresses the compressed weight vector from SRAM 570 and outputs the decompressed weight vector (i.e., the original weight vector) to a register file 580. In an alternative embodiment, another type of volatile or non-volatile memory may be used instead of SRAM 570. It is understood that FIG. 5 is a simplified diagram for illustrative purposes; additional and/or alternative circuitry may be used.

Figure 6:
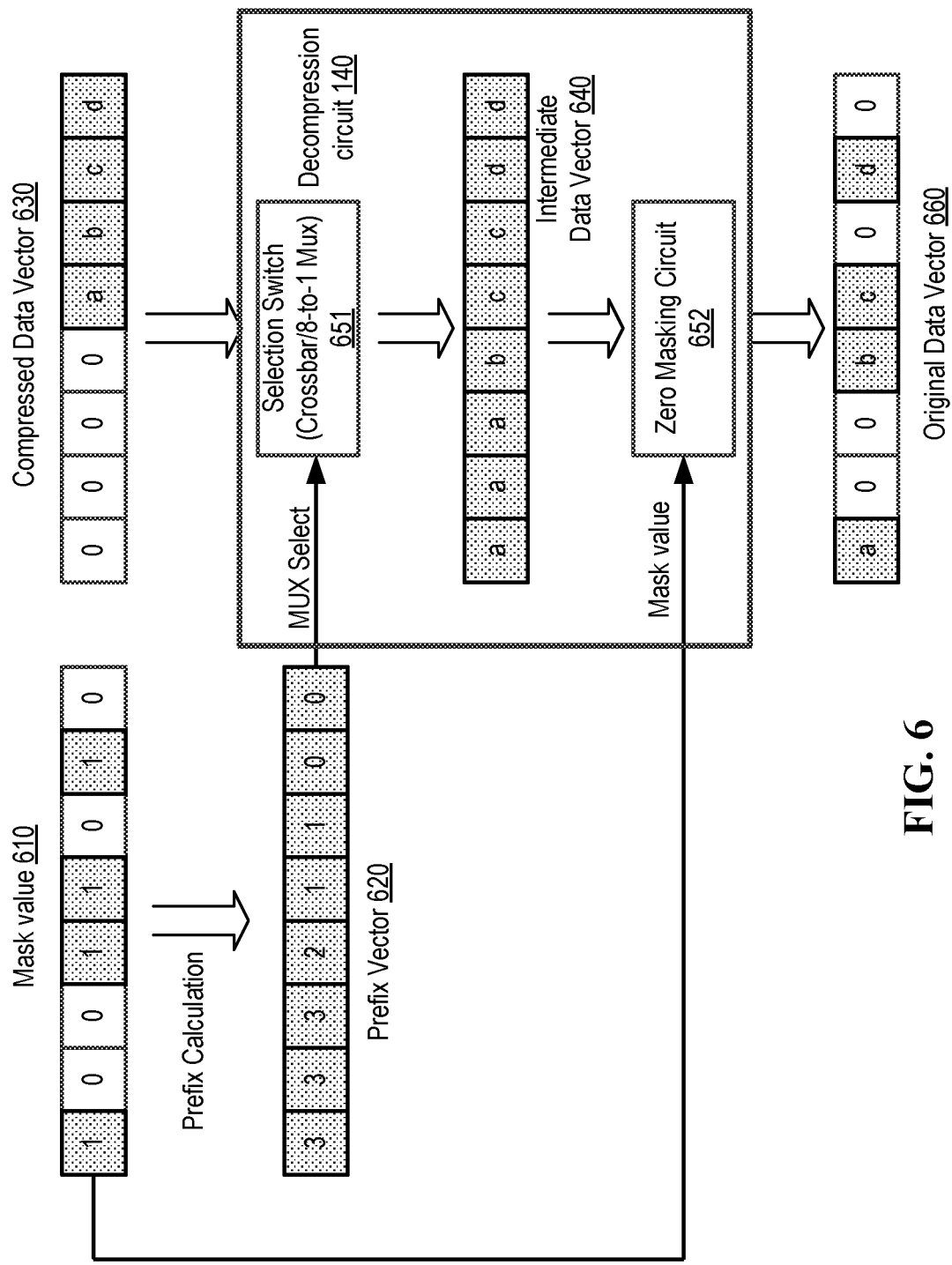
FIG. 6 is an example of data decompression according to one embodiment.

FIG. 6 is an example of data decompression according to one embodiment. In this example, each non-shaded (i.e., white) number box represents or corresponds to a zero value of the data; e.g., a weight vector. It is understood that the data decompression described herein can be applied to vectors of any length. Initially, a mask value 610 (e.g., bit sequence 10011010) is retrieved from a mask register and goes through prefix calculation to become a prefix vector 620. Concurrently, a compressed data vector 630 is retrieved from memory (e.g., SRAM). Prefix vector 620 is used by decompression circuit 140 as a selection signal (e.g., MUX select) to select non-zero values of compressed data vector 630 and shift them to the correct positions in a vector. In one embodiment, decompression circuit 140 includes a selection switch such as a crossbar switch (e.g., a crossbar 651), which includes one or more 8-to-1 multiplexers. Each value in the prefix vector 620 is used as a MUX select to select a corresponding non-zero value of compressed data vector 630; e.g., the numbers 3, 2, 1, 0 correspond to a, b, c, d, respectively. Each non-zero value of compressed data vector 630 is shifted to a corresponding position to produce intermediate data vector 640; e.g., compressed data value a at the output of crossbar 651 is shifted to occupy the leftmost three numbers of intermediate data vector 640. Decompression circuit 550 further includes a zero masking circuit 652, which applies mask value 610 on intermediate data vector 640 to produce original data vector 660. Zero masking circuit 652 zeros out the numbers in intermediate data vector 640 that correspond to binary zeros in mask value 610.

Figure 7:
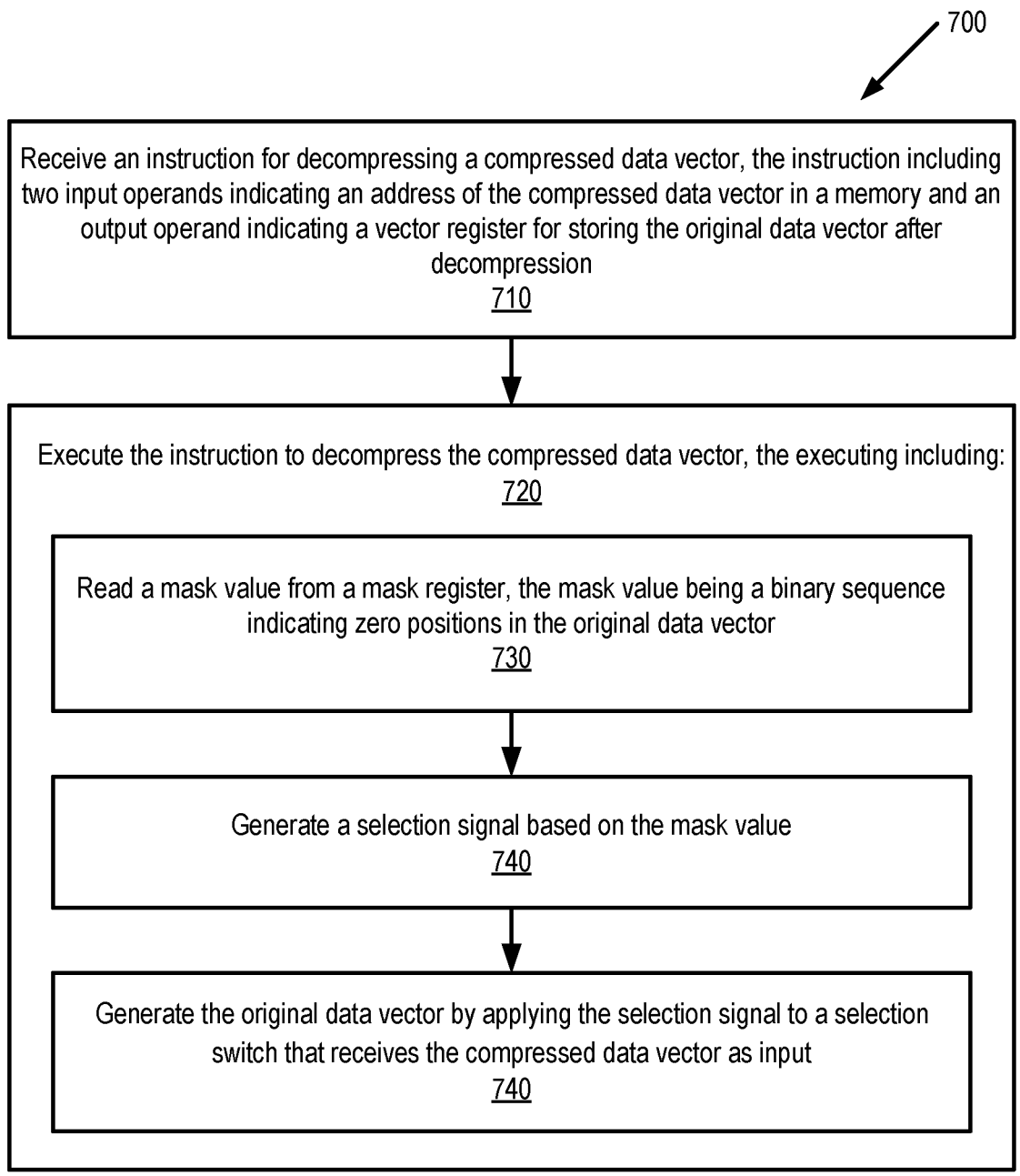
FIG. 7 is a flow diagram illustrating a method for decompressing a data vector according to one embodiment.

FIG. 7 is a flow diagram illustrating a method 700 for decompressing a data vector according to one embodiment. In one embodiment, method 700 may be performed by a processor in a system such as a system 800 in FIG. 8.

Method 700 starts with step 710 in which a processor receives an instruction for decompressing a compressed data vector. The instruction includes two input operands indicating an address of the compressed data vector in the memory and an output operand indicating a vector register for storing the original data vector after decompression. The processor at step 720 executes the instruction to decompress the compressed data vector. Step 720 includes sub-step 721 in which the processor reads a mask value from a mask register. The mask value is a binary sequence indicating zero positions in the original data vector. Step 720 further includes sub-step 722 in which the processor generates a selection signal based on the mask value. Step 720 further includes sub-step 723 in which the processor generates the original data vector by applying the selection signal to a selection switch that receives the compressed data vector as input.

In one embodiment, the two input operands of the decompress instruction include a first operand indicating a general-purpose register that stores a base address, and a second operand indicating an offset to the base address. In one embodiment, the original data vector is an array of weights for neural network computations. In one embodiment, the selection switch is a crossbar switch. In one embodiment, the processor is a RISC processor. An example of the decompress instruction is the aforementioned VLOAD_ZVC.

In one embodiment, the processor executes a set_mask instruction to retrieve the mask value from the memory and to set the mask register to the mask value. An example of the set_mask instruction is the aforementioned VSETZVC. The processor may execute a first set_mask instruction to set the mask register to the mask value, and a second set_mask instruction to set a second mask register to a second mask value before completion of the decompress instruction. The processor may execute a sequence of set_mask instructions to set multiple mask registers to respective mask values, and execute a sequence of decompress instructions. At least one of the decompress instructions may be executed concurrently with one of the set_mask instructions.

In one embodiment, the processor includes a decompression circuit to select each non-zero value of the compressed data vector, and to place the non-zero value at a position of an output vector according to the selection signal. The decompression circuit may apply the mask value to zero out selected values of the output vector to generate the original data vector. In one embodiment, the processor includes a prefix calculation circuit to generate an output for use as the selection signal based on positions of the non-zeros in the mask value.

Figure 8:
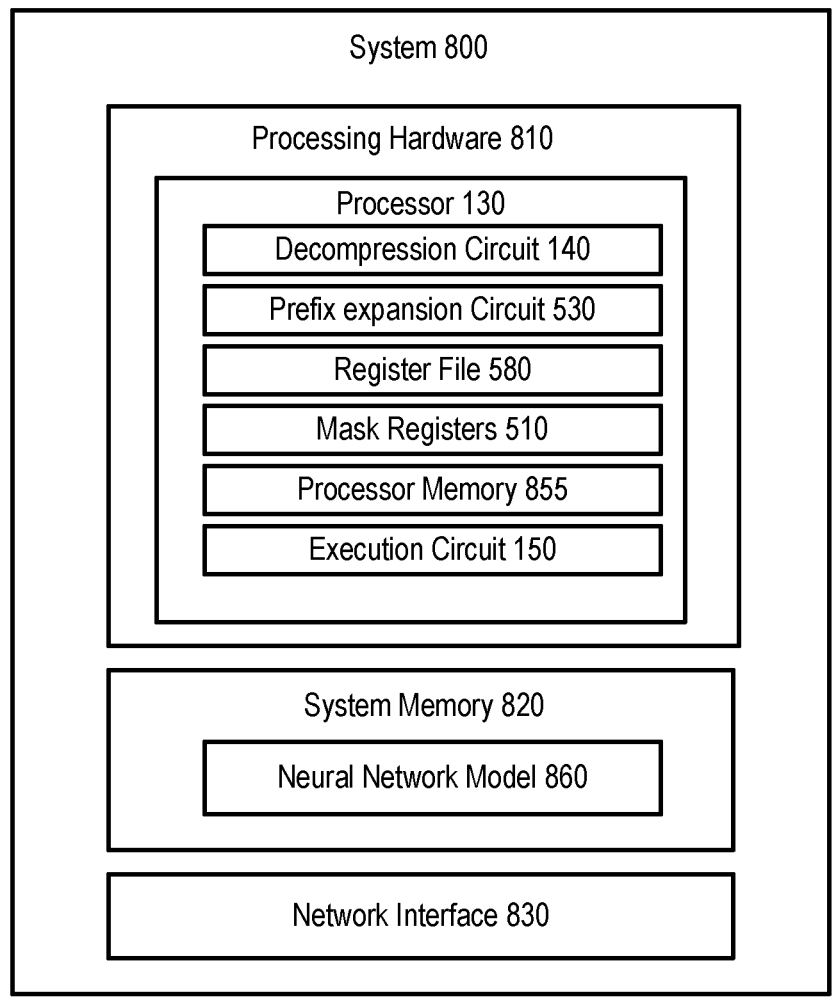
FIG. 8 is a block diagram of a system that includes a processor operative to decompress a data vector according to one embodiment.

FIG. 8 is a block diagram of a system 800 that includes processing hardware 810, a system memory 820, and a network interface 830. It is understood that system 800 is simplified for illustration; additional hardware and software components are not shown. Non-limiting examples of processing hardware 810 may include one or more processors including but not limited to a central processing unit (CPU), a graphics processing unit (GPU), a digital signal processor (DSP), a neural processing unit (NPU), a microprocessor, an image processing unit, a deep learning accelerator (DLA), and the like. One or more of the processors (e.g., processor 130) in processing hardware 810 may perform method 700 of FIG. 7.

In one embodiment, processor 130 includes decompression circuit 140, execution circuit 150, prefix calculation circuit 530, register file 580, and mask registers 510, all of which have been described before with reference to FIG. 1-FIG. 5. Processor 130 further includes processor memory 855, an example of which is SRAM 560 in FIG. 5. It is understood that processor memory 855 may further include read-only memory (ROM), flash memory, dynamic random access memory (DRAM), and/or other volatile or non-volatile memory devices. In one embodiment, the instruction set architecture (ISA) of processor 130 is extended to include the aforementioned instructions LW ZMASK, VSETZVC. VLOAD_ZVC, and any variants thereof.

System memory 820 may store a neural network model 860, which has been trained to include weights for neural computing. System memory 820 may include a DRAM device, a flash memory device, and/or other volatile or non-volatile memory devices.

The operations of the flow diagram of FIG. 7 have been described with reference to the exemplary embodiments of FIG. 1, FIG. 5, and FIG. 8. However, it should be understood that the operations of the flow diagram of FIG. 7 can be performed by embodiments of the invention other than the embodiments of FIG. 1, FIG. 5, and FIG. 8, and the embodiments of FIG. 1, FIG. 5, and FIG. 8 can perform operations different than those discussed with reference to the flow diagram. While the flow diagram of FIG. 7 shows a particular order of operations performed by certain embodiments of the invention, it should be understood that such order is exemplary (e.g., alternative embodiments may perform the operations in a different order, combine certain operations, overlap certain operations, etc.).

Various functional components or blocks have been described herein. As will be appreciated by persons skilled in the art, the functional blocks will preferably be implemented through circuits (either dedicated circuits or general-purpose circuits, which operate under the control of one or more processors and coded instructions), which will typically comprise transistors that are configured in such a way as to control the operation of the circuitry in accordance with the functions and operations described herein.

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A processor operative to decompress a compressed data vector into an original data vector, comprising:
   a mask register;
   a general-purpose register file including a vector register; and
   an execution circuit operative to:
   receive a decompress instruction that includes two input operands indicating an address of the compressed data vector in a memory and an output operand indicating the vector register for storing the original data vector after decompression; and
   execute the decompress instruction to decompress the compressed data vector, wherein the execution circuit when executing the decompress instruction is further operative to:
   read a mask value from the mask register, the mask value being a binary sequence indicating zero positions in the original data vector;
   generate a selection signal based on the mask value; and
   generate the original data vector by applying the selection signal to a selection switch that receives the compressed data vector as input.

2. The processor of claim 1, wherein the execution circuit is further operative to:
   execute a set_mask instruction to retrieve the mask value from the memory and to set the mask register to the mask value.

3. The processor of claim 1, wherein the execution circuit is further operative to:
   execute a first set_mask instruction to set the mask register to the mask value; and
   execute a second set_mask instruction to set a second mask register to a second mask value before completion of the decompress instruction.

4. The processor of claim 1, further comprising:
   a plurality of mask registers, wherein the execution circuit is further operative to:
   execute a sequence of set_mask instructions to set the mask registers to respective mask values; and
   execute a sequence of decompress instructions, at least one of the decompress instructions being executed concurrently with one of the set_mask instructions.

5. The processor of claim 1, wherein the compressed data vector includes one or more non-zero values, the processor further comprises:
   a decompression circuit, which includes the selection switch to select each non-zero value of the compressed data vector and place the non-zero value at a position of an output vector according to the selection signal.

6. The processor of claim 5, wherein the decompression circuit further comprises:
   a zero masking circuit coupled to an output end of the selection switch, wherein the zero mask uses the mask value to zero out selected values of the output vector to generate the original data vector.

7. The processor of claim 1, wherein the mask value includes one or more non-zeros, the processor further comprises:
a prefix calculation circuit to generate an output for use as the selection signal based on positions of the non-zeros in the mask value.

8. The processor of claim 1, wherein the two input operands include a first operand indicating a general-purpose register that stores a base address, and a second operand indicating an offset to the base address.

9. The processor of claim 1, wherein the original data vector is an array of weights for neural network computations.

10. The processor of claim 1, wherein the selection switch is a crossbar switch.

11. The processor of claim 1, wherein the processor is a Reduced Instruction Set Computer (RISC) processor.

12. A method for decompressing a compressed data vector into an original data vector, comprising:
receiving a decompress instruction that includes two input operands indicating an address of the compressed data vector in a memory and an output operand indicating a vector register for storing the original data vector after decompression; and
executing the decompress instruction to decompress the compressed data vector, wherein executing the decompress instruction further comprises:
reading a mask value from the mask register, the mask value being a binary sequence indicating zero positions in the original data vector;
generating a selection signal based on the mask value; and
generating the original data vector by applying the selection signal to a selection switch that receives the compressed data vector as input.

13. The method of claim 12, further comprising:
executing a set_mask instruction to retrieve the mask value from the memory and to set the mask register to the mask value.

14. The method of claim 12, further comprising:
executing a first set_mask instruction to set the mask register to the mask value; and
executing a second set_mask instruction to set a second mask register to a second mask value before completion of the decompress instruction.

15. The method of claim 12, further comprising:
executing a sequence of set_mask instructions to set a plurality of mask registers to respective mask values; and
executing a sequence of decompress instructions, at least one of the decompress instructions being executed concurrently with one of the set_mask instructions.

16. The method of claim 12, wherein the compressed data vector includes one or more non-zero values, the method further comprises:
selecting, by a decompression circuit, each non-zero value of the compressed data vector; and
placing the non-zero value at a position of an output vector according to the selection signal.

17. The method of claim 16, further comprising
applying, by the decompression circuit, the mask value to zero out selected values of the output vector to generate the original data vector.

18. The method of claim 12, wherein the mask value includes one or more non-zeros, the method further comprises:
generating an output for use as the selection signal based on positions of the non-zeros in the mask value.

19. The method of claim 12, wherein the two input operands include a first operand indicating a general-purpose register that stores a base address, and a second operand indicating an offset to the base address.

20. The method of claim 12, wherein the original data vector is an array of weights for neural network computations.

* * * * *